(12) United States Patent
Heinrich

(10) Patent No.: US 6,265,921 B1
(45) Date of Patent: Jul. 24, 2001

(54) CIRCUIT CONFIGURATION FOR SHAPING SLEW RATE

(75) Inventor: Peter Heinrich, Edling (DE)

(73) Assignee: STMicroelectronics GmbH, Grasbrunn (DE)

( * ) Notice: Subject to any disclaimer, the term of this patent is extended or adjusted under 35 U.S.C. 154(b) by 0 days.

(21) Appl. No.: 09/393,128

(22) Filed: Sep. 10, 1999

(30) Foreign Application Priority Data

Sep. 11, 1998 (DE) .............................................. 198 41 719

(51) Int. Cl.⁷ ...................................................... H03K 5/12
(52) U.S. Cl. ............................................. 327/170; 327/134
(58) Field of Search .................................... 327/170, 134, 327/131, 132, 135, 137, 108, 110, 374, 380, 388, 387

(56) References Cited

U.S. PATENT DOCUMENTS

| | | | |
|---|---|---|---|
| 3,903,735 | 9/1975 | Wilson | 73/105 |
| 4,268,794 | 5/1981 | Handte et al. | 327/341 |
| 4,651,032 | 3/1987 | Nobuta | 327/134 |
| 4,746,842 | 5/1988 | Ponte et al. | 315/403 |
| 4,945,292 | 7/1990 | Ackerson et al. | 315/387 |
| 5,502,410 | 3/1996 | Dunn et al. | 327/140 |
| 5,519,338 | 5/1996 | Campbell et al. | 326/27 |
| 5,742,193 | * 4/1998 | Colli et al. | 327/170 |
| 5,939,909 | * 8/1999 | Callahan, Jr. | 327/108 |

* cited by examiner

Primary Examiner—Tuan T. Lam
(74) Attorney, Agent, or Firm—Theodore E. Galanthay; E. Russell Tarleton; Seed IP Law Group PLLC

(57) ABSTRACT

An electric circuit configuration for shaping the slew rate of a pulsed output voltage occurring at an output terminal and for detecting a short circuit at the output terminal, having: a switchover control circuit for controlling the slew rate of the output voltage as a function of a voltage curve occurring across an internal resistor in a first switching state, and for feedback-controlling the slew rate as a function of the output voltage curve in a second switching state, and which is in a substantially dead state in a third switching state; a detector circuit which provides a detection signal when the output voltage differs by at least a predetermined value from the output voltage level occurring before edge onset; and a timer circuit for switching the control circuit from the first to the second switching state a predetermined length of time after edge onset if the detection signal is present at this time, and from the first to the third switching state if the detection signal is not present at this time.

20 Claims, 2 Drawing Sheets

CIRCUIT CONFIGURATION FOR SHAPING SLEW RATE

TECHNICAL FIELD

This invention relates to an electric circuit configuration for shaping the slew rate of a pulsed output voltage occurring at an output terminal and for detecting a short circuit at the output terminal.

BACKGROUND OF THE INVENTION

Such a circuit configuration conventionally has a control loop with an operational amplifier whose inverting input is connected with the output terminal via a capacitor, whose noninverting input is connected with a reference current source and whose output is connected with the control input of a transistor. The output terminal is connected via a resistor with a first supply voltage terminal, which normally has a positive potential, and via the transistor with a second supply voltage terminal, which usually has ground potentials The capacitor supplies the inverting input of the operational amplifier with a capacitor current $$Ic = C \cdot dU/dt, \tag{1}$$

where C is the capacitance of the capacitor, U the voltage drop across the resistor and t the time. At constant voltage, i.e., outside the edges of a pulsed signal, the capacitor current is Ic=0, while it is nonzero during the presence of pulse edges. The operational amplifier adjusts the capacitor current to the value of the reference current, which corresponds to a very definite steepness of the voltage drop across the resistor.

One performs slew rate control for example to reduce the high-frequency electromagnetic interference connected with steep pulse edges.

The output terminal of the control circuit can be connected for example to a bus line, e.g., one of the double lines of a CAN bus system as used nowadays in motor vehicles. The abbreviation CAN stands for controlled area network.

In such bus systems, for example, it can happen that the bus line connected to the output terminal of the control circuit has at some place a short circuit to the positive supply voltage terminal. In this case the resistor between the output terminal of the control circuit and said positive supply voltage terminal is short-circuited. Since such a short circuit leads to a constant potential value at the output terminal of the control circuit, the capacitor current becomes zero and the control circuit attempts to drive the transistor to maximum current output in order to bring the capacitor current back to the current strength of the reference current source.

The problems entailed by such a short circuit, namely high current consumption and high power dissipation, can be remedied by providing a short-circuit protecting circuit that causes a switch-off of the control circuit when the transistor current has exceeded a certain protective threshold.

Although such a protecting circuit offers protection from lengthy short circuits, serious problems still remain.

The load acting at the output terminal of the control circuit is virtually always inductive, at least because a line connected to said output terminal has a line inductance. A high short-circuit current before the time of protective switch-off results in accordingly high magnetic energy collecting in the load inductance and leading at the time of protective switch-off to inductive voltage pulses that can assume relatively high voltage levels.

Such voltage pulses result in relatively high electromagnetic interference, on the one hand, and involve the danger of signal decoders in the form of comparators connected to the line misinterpreting such inductive voltage pulses as signal or data pulses, resulting in a falsification of data transferred via the line, on the other hand.

SUMMARY OF THE INVENTION

An embodiment of a circuit configuration disclosed herein includes a switchover control circuit for controlling the slew rate of the output voltage as a function of a voltage curve occurring across an internal resistor in a first switching state, and feedback for controlling it as a function of the output voltage curve in a second switching state, and which is in a substantially dead state in a third switching state. The internal resistor is a different resistor from the resistor connected to the output terminal. The internal resistor is thus not impaired by a short circuit bridging the resistor connected to the output terminal.

Furthermore the circuit configuration has a detector circuit that provides a detection signal when the output voltage differs by at least a predetermined value from the output voltage level occurring before edge onset. A timer circuit is also provided for switching the control circuit from the first to the second switching state a predetermined length of time after edge onset if the detection signal is present at this time, and from the first to the third switching state if the detection signal is not present at this time.

The disclosed circuit configuration thus begins controlling the slew rate of the output voltage occurring at the output terminal, this control being guided by an element, in one embodiment the internal resistor, which is not affected by a short circuit at the output terminal. During this phase, in which the control circuit is in the first switching state, no higher current can thus flow, even if it corresponds to the desired slew rate, if a short circuit is present at the output terminal of the circuit configuration.

The detection circuit is used to compare whether the instantaneous voltage level of the edge to be controlled has a predetermined minimum distance from that voltage level present before edge onset. If such a minimum distance from the voltage level before edge onset is given, the detection circuit provides a detection signal signaling this.

The timer circuit is used to determine whether the detection signal is present at the end of a predetermined length of time since edge onset, i.e., the instantaneous output voltage level has reached the minimum distance from the voltage level occurring before edge onset.

If this is the case it can be assumed that no short circuit is present. However, if the instantaneous voltage level has not reached the minimum distance from the voltage level occurring before edge onset at the end of this length of time, the presence of a short circuit is assumed.

The distance the edge voltage must have from the voltage occurring before edge onset in order to provide the detection signal is selected to be so great that it cannot be reached under short circuit conditions.

If the detection signal, and thus no short circuit, is present at the end of the stated length of time, the control circuit is switched to the second switching state in which there is a switchover from slew rate control as a function of the voltage drop across the internal resistor to feedback control of the slew rate as a function of the voltage occurring at the output terminal.

If the detection signal is not present at the end of the stated length of time and a short circuit is therefore to be assumed, the control circuit is switched to the third switching state in which the control circuit is made dead or substantially dead.

The disclosed circuit configuration reacts to a short circuit only when a predetermined maximum current strength possible only under short circuit conditions is exceeded, but it already ascertains the presence of a short circuit toward the onset of the particular edge while the slew rate is still being controlled as a function of the internal resistor, so that a short circuit at the output terminal cannot yet have a current-increasing effect.

Since the current flowing at the output terminal increases more and more as the edge is increasingly traversed but the circuit configuration is already made dead upon detection of a short circuit in the area of the onset of the particular edge, at which time the current flowing at the output terminal is still relatively low, little magnetic energy is stored in the load inductance at the time of switchover of the control circuit to the third switching state, i.e., at the time the circuit configuration is made dead. One consequently avoids higher inductive voltage glitches when the circuit configuration is made dead, and the accompanying electromagnetic interference and signal misinterpretations.

With the disclosed circuit configuration, the current flowing as of the onset of the edge has a slow rise even under short circuit conditions and one avoids a high short-circuit current, high power dissipation, high-frequency electromagnetic interference and signal misinterpretations.

In one embodiment of the circuit configuration, the control circuit has two control loops, one of which has the internal resistor and the other of which the resistor connected to the output terminal, a first switchover device being provided for performing a switchover between the first and second switching states, i.e., a switchover with respect to the particular active control loop. Furthermore, a second switchover device can be provided for making both control loops dead or substantially dead if a short circuit is recognized.

Both control loops can be constructed in the manner of the conventional control circuit explained at the outset, using a common operational amplifier with a common reference current source for both loops, and, in one embodiment, the two capacitors, the two transistors and the two resistors being different. A switch is assigned to each of the capacitors, the two switches forming the first switchover device.

In an embodiment of the circuit configuration, the detector circuit has a comparator that compares a sum voltage of the instantaneous output voltage and a constant offset voltage with the output voltage level prevailing before edge onset. One can use for this purpose a storage circuit in which the output voltage prevailing before edge onset has been sampled and stored in order to be available for said comparison.

In another embodiment of the circuit configuration, the timer circuit includes a counter that is set counting at edge onset and, when reaching a predetermined count, provides a time lapse signal defining the lapse of the predetermined length of time at which one checks whether the instantaneous voltage level at the output terminal of the circuit configuration already has the distance from the voltage level present before edge onset, which must be reached for the assumption that no short circuit is present.

In yet another embodiment of the circuit configuration that has two control loops, one can make the resistance value of the internal resistor greater than the resistance value of the resistor connected to the output terminal (which depends on the resistance of the line connected to the output terminal) in order to minimize the current flowing through the internal resistor, which must be supplied by the semiconductor chip containing the circuit configuration. So that the edge shapes at least substantially match during the phase of slew rate control by the first loop and during the phase of slew rate feedback control by the second loop, one can make the active areas of the first and second transistors different roughly in proportion with the resistance ratio of said resistors. That is, the first-loop internal resistor having a high resistance value is assigned a first transistor with a lower active transistor area, while the transistor of the second loop has a smaller active transistor area corresponding to the resistance effective at the output terminal.

BRIEF DESCRIPTION OF THE DRAWINGS

Further functions, aspects and advantages of the circuit configuration will now be explained in more detail with reference to the disclosed embodiments and the accompanying drawings, wherein.

DETAILED DESCRIPTION OF THE INVENTION

Figure 1:
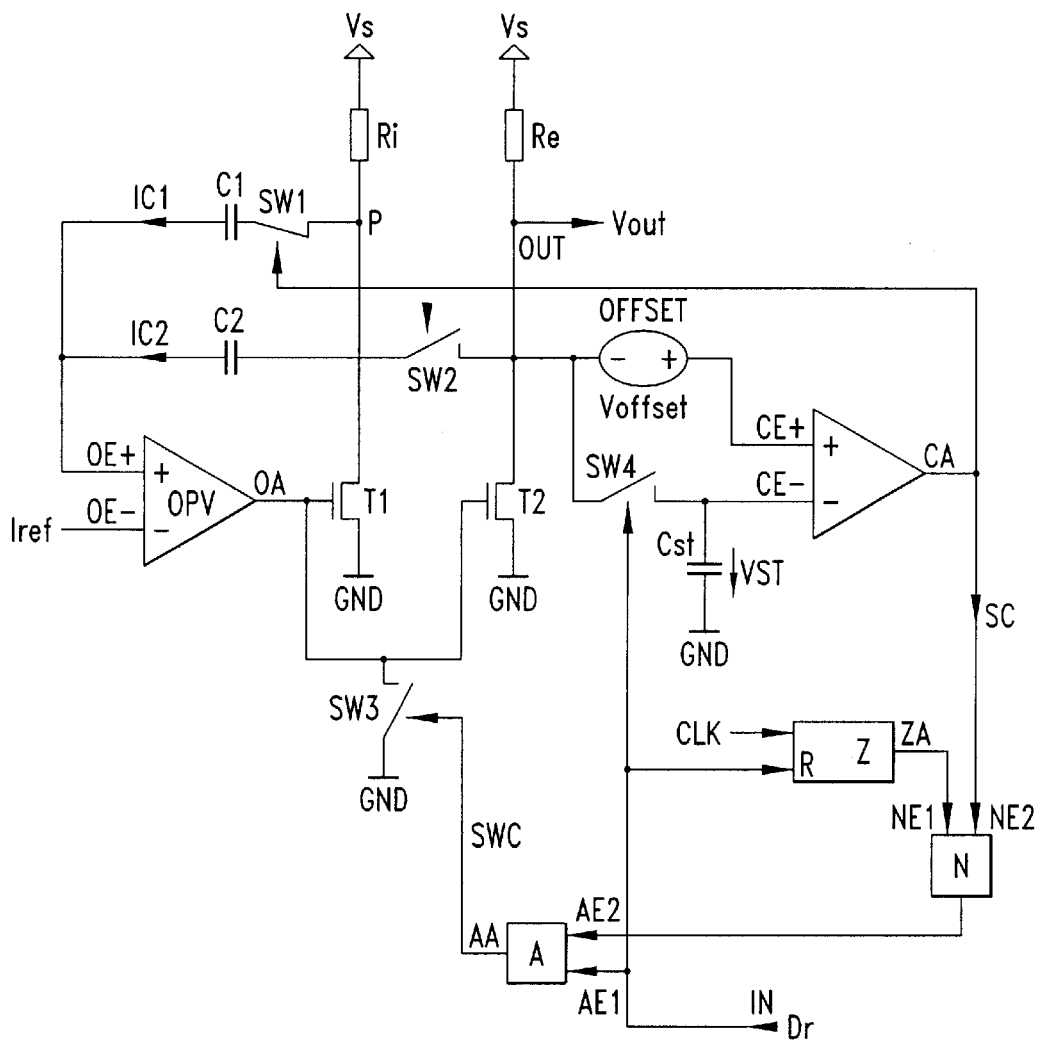
FIG. 1 shows an exemplary embodiment of a circuit configuration.

An embodiment of a circuit configuration is shown in FIG. 1. This circuit configuration has input terminal IN for supplying driver signal Dr and output terminal OUT to which a line, for example bus line, is connected and from which output voltage Vout can be taken.

This circuit configuration comprises a control circuit with two control loops, a detector circuit and a timer circuit.

A first control loop comprises transistor T1, internal resistor Ri, first capacitor C1, first switch SW1, operational amplifier OPV and reference current source Iref Ri and T1 form a series connection between positive supply voltage terminal Vs and ground terminal GND, Ri being on the high potential side and T1 on the low potential side.

Noninverting first input OE+ of operational amplifier OPV is connected via a series connection with first capacitor C1 and first switch SW1 with connecting point P between Ri and T1. Reference current source Iref is connected between inverting second input OE– of operational amplifier OPV and GND. Connected to output OA of OPV is a gate electrode of first transistor T1.

The second control loop comprises external resistor Re, second transistor T2, second capacitor C2, second switch SW2 and operational amplifier OPV. Re and T2 form a series connection between Vs and GND, output terminal OUT being between Re and T2. OE+ is connected via a series connection with second capacitor C2 and second switch SW2 with output terminal OUT. A gate electrode of T2 is connected to output OA of operational amplifier OPV. The interconnected gate terminals of transistors T1 and T2 are connected with GND via third switch SW3.

The detector circuit comprises comparator COMP with noninverting first input CE+, inverting second input CE– and output CA. First input CE+ is connected to output terminal OUT via offset voltage source OFFSET. Between OUT and CE– there is a sampling and storage circuit with storage capacitor Cst and fourth switch SW4. SW4 is connected between OUT and CE–, and Cst between CE– and GND.

The timer circuit comprises counter Z, NAND element N and AND element A. Counter Z has counting clock input ZLK, reset input R and counter output ZA. The NAND element has first input NE1, second input NE2 and output NA. The AND element has first input AE1, second input AE2 and output AA. Counting clock input ZLK is connected with a counting clock source (not shown). A gate of fourth switch SW4, reset input R of counter Z and first input AE1 of AND element A are connected with input terminal IN so that they are supplied driver signal Dr.

A control input of first switch SW1, a control input of second switch SW2 and second input NE2 of NAND element N are connected with output CA of comparator COMP. The first input NEI of the NAND element N is connected to the output ZA of the counter Z. Second input AE2 of AND element A is connected with output NA of NAND element N. A gate of third switch SW3 is connected with output AA of AND element A.

Figure 2:
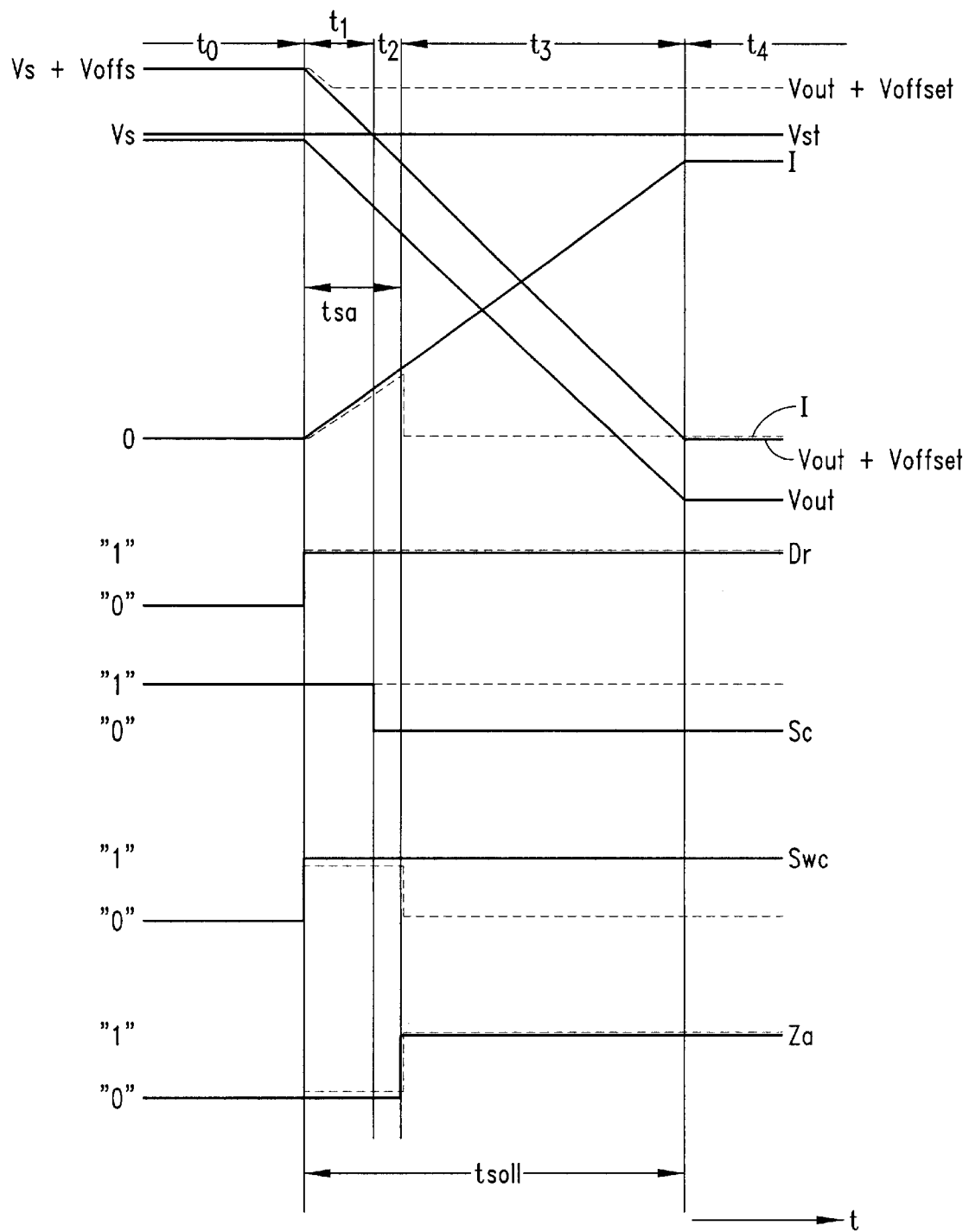
FIG. 2 shows voltage and current curves as occur in the circuit configuration shown in FIG. 1 in the normal case and under short circuit conditions.

The mode of operation of the circuit configuration shown in FIG. 1 will now be explained with the aid of the voltage and current curves shown in FIG. 2. In FIG. 2 representations with unbroken lines belong to the non-short-circuited case and representations with dashed lines to the short-circuited case.

The case first considered is that the circuit configuration works normally, that is, no short circuit is present at output terminal OUT.

The circuit configuration is so designed that signal SC occurring at comparator output CA always has a logic value "1" at edge onset. At a later time, signal SC goes from "1" to "0", whereby SC="0" is viewed here as the detection signal for detecting a non-short-circuited state. At edge onset the circuit configuration thus always assumes the presence of a short circuit for safety's sake, even if this is not confirmed by the following check.

The signal shape of output voltage Vout occurring at output terminal OUT is controlled by means of driver signal Dr supplied to input terminal IN. In the example in question, it is assumed that driver signal Dr controls pulsed output voltage Vout with pulse edges feedback-controlled with respect to their steepness and thus with respect to their duration. When the circuit configuration is driven to an off state by driver signal Dr, Vout is virtually at the voltage level of supply voltage Vs and current I flowing at output OUT is virtually equal to zero. In the on state the circuit configuration supplies nonzero current I and output voltage Vout is virtually at ground potential GND.

In the embodiment in question one assumes that driver signal Dr with a low potential value, referred to here as logic value "0" for example, drives the circuit configuration to the off state, while a high potential value, assigned the logic value "1", drives the circuit to the current-supplying on state. This is indicated by FIG. 2, which shows five time segments t0 to t4. During time segment t0 driver signal Dr has low potential and output voltage Vout is virtually at the voltage level of supply voltage potential Vs. During time segment t0 fourth switch SW4 is in the on state so that the voltage level of Vout, which is virtually Vs at this time, is stored in storage capacitor Cst.

Offset voltage source OFFSET is polarized so that a voltage level higher than Vout by Voffset appears at input CE+ of comparator COMP. During time segment t0 CE+ is therefore at a sum voltage level of Vs+ Voffset, as shown in FIG. 2.

As indicated by FIG. 2, the output voltage drops after edge onset under short circuit conditions only by a relatively small amount relative to the voltage level before edge onset. The amount of offset voltage Voffset is selected so as to be in any case greater than the amount by which output voltage Vout drops under short circuit conditions relative to the voltage level before edge onset.

When driver signal Dr passes from "0" to "1" at the beginning of time segment t1 fourth switch SW4 is driven from the on to the off state so that the voltage level of Vout present before this switchover of Dr, i.e., voltage level Vs, is kept stored in storage capacitor Cst.

During t0 driver signal Dr at "0" kept counter Z in the reset state via input R. The logic value "0" at input NE1 and the logic value "1" at input NE2 of NAND element N resulted in a logic value "1" at input AE2 of AND element A, which led together with the logic value "O" of driver signal Dr to a logic value "0" at output AA of AND element A which drove third switch SW3 to the on state. Therefore, the gate terminals of transistors T1 and T2 were at ground potential GND, thereby making the circuit configuration dead.

Because of the transition of driver signal Dr from "0" to "1" at the beginning of time segment t1 there is a change of logic value at output AA from "0" to "1", thereby driving SW3 to the off state.

A logic value "1" of signal SC occurring at comparator output CA means that switch SW1 and switch SW2 are nonconductive, these switching states being shown in FIG. 1. When SW3 opens, the first control loop with capacitor C1 therefore becomes active at the beginning of time segment t1, while the second control loop with capacitor C2 remains inactive since switch SW2 is nonconductive.

When switch SW3 is rendered nonconductive a rising current thus begins to flow through transistor T1, which is feedback-controlled to match reference current Iref. This current corresponds to a desired steepness of the edge beginning at the beginning of time segment t1. Since the output signal of operational amplifier OPV is supplied not only to the gate terminal of transistor T1 but also to the gate terminal of transistor T2, the current flowing through T2 is controlled as a function of the control result of the first control loop. That is, when time segment t1 begins the steepness of the edge of output voltage Vout occurring at output terminal OUT is controlled as a function of the control result of the first control loop and thus as a function of the change in voltage drop occurring across Ri. As output voltage Vout decreases in keeping with the edge, the amount of sum voltage Vout+Voffset at input CE+ of comparator COMP also decreases, which is compared with voltage level Vst stored in storage capacitor Cst, i.e., the voltage level of Vout present before edge onset, i.e., virtually Vs. As long as the sum voltage available at C+ is higher than stored voltage Vst available at CE– signal SC remains at the logic value "1" and switches SW1 and SW2 remain in the switching states shown in FIG. 1, so that the first control loop remains active and the second control loop inactive.

As soon as sum voltage Vout+Voffset drops below voltage level Vst stored in Cst, output CA of comparator COMP and thus signal SC switches from "1" to "0". The comparator output thus provides detection signal SC ="0" which detects nonshort-circuited operation. This takes place at the beginning of time segment t2. As a result, SW1 is rendered nonconductive and SW2 conductive, thereby making the first 20 control loop with capacitor C1 inactive and the second control loop with capacitor C2 active. Therefore, no longer capacitor current Ic1, but capacitor current Ic2, is adjusted to reference current Iref as of the beginning of t2. From this time on, output voltage Vout is no longer controlled as a function of the first control loop but feedback controlled via the second control loop.

In the representation in FIG. 2 it is assumed that the slew rate remains unchanged at the transition from time segment t1 to time segment t2. This can be obtained by equalizing the currents through series connections Ri, T1, on the one hand, and Re, T2, on the other hand. In order to attain low power dissipation in the first control loop, which must be supplied by the chip of the integrated circuit containing the inventive circuit configuration, one preferably makes the resistance value of Ri much greater than the resistance value effective at output terminal OUT. In order to obtain a current mirroring of 1:1 nevertheless, the active areas of transistors T1 and T2 are made different accordingly.

To obtain an equal dU/dt, i.e., equal steepness, at different resistance values for Ri and Re (the resistor acting at OUT) one selects a greater active area for T1 and a smaller one for T2, in accordance with the ratio between internal resistor Ri and resistor Re acting at OUT. The resistor with the greater resistance value is thus assigned a transistor with a greater active area and the resistor with the smaller resistance value a transistor with a smaller active area.

The timer circuit is used to check whether or not the sum voltage at input CE+ has dropped below stored voltage CE− at the end of time segment t2, which corresponds to length of time tsw since edge onset. This is obtained by switching its counter Z from the reset state to a start count state with the change of logic value of driver signal Dr at edge onset. When time segment tsw begins counter Z therefore begins to count the clock pulses supplied thereto. When a predetermined count corresponding to length of time tsw is reached, output ZA of counter Z switches from "0" to "1" as shown in FIG. 2. Since at the beginning of t2 the sum voltage at CE+ had already dropped below the stored voltage level at CE− and SC had passed to the logic value "0", the logic value "1" remains at the output of N, so that third switch SW3 still remains nonconductive and the feedback control action continues by means of the second control loop. The trailing edge of Vout or the rising edge of I thus continues in time segment t3 until the control circuit has rendered transistor T2 maximally conductive and output voltage Vout and current I flowing through T2 remain constant from then on, as shown in time segment t4 in FIG. 2.

We will now look more closely at the case in which a short circuit bridging external resistor Re is present at output terminal OUT. If a short circuit is present at the time Dr switches from "0" to "1" at the beginning of time segment t1, output voltage Vout first decreases somewhat because internal resistances and external line resistances lead to a nonzero resistance value at which there is a certain voltage drop. This causes a current rise first to occur and a corresponding voltage drop at the resistance value acting under short circuit conditions. Since during time segment t1 the current supplied by transistor T2 is controlled as a function of the first control loop, namely as a function of Ri, there is no greatly increasing short-circuit current at edge onset but a current increase as would occur at this time in non-short-circuited operation too. Since the current through T2 is not subject to feedback control during edge onset but to control by the first control loop, a rise to very high short-circuit current is thus prevented.

Under short circuit conditions, however, output voltage Vout drops only to a relatively small level below supply voltage Vs. A drop of sum voltage Vout+Voffset below voltage level Vs of the output voltage before edge onset stored in Cst is therefore not reached when counter Z has reached its predetermined count number at the end of length of time tsw since edge onset and its output ZA passes from "0" to "1". Signal SC ="1" is therefore still present at the end of tsw, i.e., detection signal SC="0" has not occurred, which leads to a logic value "0" at output NA of NAND element N. Together with the logic value "1" of Dr at input AE2 of AND element A a change of switch control signal SWC from "1" to "0" therefore occurs at its output AA. This causes third switch SW3 to be driven to the on state at the end of time segment tsw, thereby driving transistors T1 and T2 to the off state. Current I flowing to output OUT thus stops and the circuit configuration is virtually dead.

Since current I is subject to control by the first control loop dependent on internal resistor Ri at edge onset under short circuit conditions too, a slew rate of the predetermined kind is controlled during edge onset even under short circuit conditions and electromagnetic interference due to an excessive slew rate being avoided. Since current I is already switched off in a very early and low stage, namely at the end of tsw, under short circuit conditions, no high current flow can occur under short circuit conditions, and therefore no storage of high magnetic energy in load inductances. No high inductive voltage glitches at the time of protective switch-off due to a short circuit can therefore occur and consequently no accompanying electromagnetic interference and/or signal misinterpretations.

In summary, the foregoing is obtained by depriving the second control loop of its feedback control power during an onset phase of the edge and by subjecting events at output terminal OUT to compulsory control by the first control loop; by adjusting the edge to the predetermined steepness during said compulsory control regardless of whether or not a short circuit is present; by observing whether the output voltage has changed relative to the voltage level prevailing before edge onset within certain time period tsw to an extent only possible in a non-short-circuited case; and then, if no such change is reached up to the end of this time period, by making the circuit configuration dead. This switch-off is effected a relatively short time after edge onset and before the short circuit can lead to a high short-circuit current with the stated problems.

The disclosed circuit configuration can be used in connection with bus lines, but also in all other cases where slew rate control is desired. While a representative embodiment has been illustrated and described, it is to be understood that various changes can be made without departing from the spirit and scope of the invention. Thus, the invention is to be limited only by the scope of the accompanying claims.

What is claimed is:

1. An electric circuit configuration for shaping the slew rate of a pulsed output voltage occurring at an output terminal and for detecting a short circuit at the output terminal, comprising:

a switchover control circuit having a first switching state for controlling the slew rate of the output voltage as a function of a voltage curve occurring on an internal electric apparatus, and a second switching state for feedback-controlling the output voltage slew rate as a function of the output voltage, and a third switching state that is a substantially dead state;

a detector circuit configured to provide a detection signal when the output voltage differs by at least a predetermined value from the output voltage level occurring before edge onset of the output voltage; and a timer circuit for switching the switchover control circuit from the first to the second switching state a predetermined length of time after edge onset of the output voltage when the detection signal is present at this time, and from the first to the third switching state when the detection signal is not present at this time.

2. The circuit configuration of claim 1 wherein the switchover control circuit comprises:
   a first control loop for controlling the slew rate of the output voltage as a function of a voltage curve occurring across an internal resistor;
   a second control loop for feedback-controlling the slew rate of the output voltage as a function of the output voltage; and
   a first switchover device driven by the detection signal for making the first control loop active and the second control loop inactive (first switching state of the control circuit), or the second control loop active and the first control loop inactive (second switching state of the control circuit), as a function of whether the detection signal is not present or is present.

3. The circuit configuration of claim 2 wherein the control circuit comprises:
   a second switchover device driven by the timer circuit for making the first and second control loops dead (third switching state of the control circuit) when the detection signal is not present at the end of the predetermined length of time after edge onset of the output voltage.

4. The circuit configuration of claim 3 wherein the first control loop comprises:
   a first series connection with a first transistor and the internal resistor between two different supply voltage terminals,
   a first capacitor, one side of which is connected to a connecting point between the first transistor and the internal resistor; and
   a differential amplifier with a first amplifier input coupled with a second side of the first capacitor, with a second amplifier input coupled with a reference current source, and an amplifier output; and
   the second control loop including:
      a second series connection with a second transistor and an external resistor between the two supply voltage terminals; and
      a second capacitor connected between the output terminal and the first amplifier input;
         whereby the two transistors each have a control input coupled with the amplifier output.

5. The circuit configuration of claim 4 wherein the first switchover device comprises a first switch connected between the connecting point and the first capacitor, and a second switch connected between the output terminal and the second capacitor.

6. The circuit configuration of claim 4 wherein the second switchover device comprises a third switch connected between the control inputs of the two transistors and that of the two supply voltage terminals whose potential drives the two transistors to the dead state.

7. The circuit configuration of claim 6 wherein the detector circuit comprises:
   a comparator with a noninverting comparator input, an inverting comparator input and a comparator output;
   an offset voltage source connected between the noninverting comparator input and the output terminal by reason of which a sum voltage equal to the sum of the output voltage and the offset voltage occurs at the noninverting comparator input; and
   a sampling and storage circuit for sampling and storing the output voltage occurring before edge onset of the output voltage;
      whereby the detection signal arises at the comparator output when the sum voltage differs by the predetermined value from the voltage level stored in the sampling and storage circuit.

8. The circuit configuration of claim 7 wherein the sampling and storage circuit comprises a fourth switch connected between the output terminal and the inverting comparator input, and a storage capacitor between the inverting comparator input and that of the two supply voltage terminals, the fourth switch being conductive before edge onset of the output voltage and rendered nonconductive upon edge onset of the output voltage.

9. The circuit configuration of claim 1 wherein the timer circuit comprises:
   a control signal source;
   a counter with a clock input, a reset input connected with the control signal source, and a counter output;
   a NAND operation circuit with a first input coupled with the counter output, a second input coupled with the comparator output of the detection circuit, and an output; and
   an AND operation circuit with a first input coupled with the output of the NAND operation circuit, a second input coupled with the control signal source, and an output which provides a switch control signal for a third switch;
   the counter configured to provide a time lapse signal at its counter output when it has reached a predetermined count;
   a fourth switch driven by the control signal source; and
   the timer circuit is configured to render the third switch conductive when the detection signal is not yet present at the end of the predetermined length of time from edge onset of the output signal.

10. The circuit configuration of claim 4 wherein the internal resistor has a higher resistance value than the resistance value effective at the output terminal, and the first transistor has a higher active transistor area than the second transistor, such that the slew rate controlled by the first control loop at least roughly matches the slew rate that is feedback-controlled by the second control loop.

11. A circuit, comprising:
   first and second switch elements each having a first terminal coupled to a common voltage potential, a second terminal coupled to a ground reference potential, and a control terminal;
   a first resistive element coupled in series between the first terminal of the first switch element and the common voltage potential, and a second resistive element coupled in series between the first terminal of the second switch element and the common voltage potential;
   an operational amplifier having an output coupled to the control terminal of the first and second switch elements, an inverting input coupled to a reference current, and a non-inverting input;
   a first capacitive element and first switch coupled in series between the operational amplifier non-inverting input and the first terminal of the first switch element, and a second capacitive element and second switch coupled in series between the operational amplifier non-inverting input and the first terminal of the second switch element;
   a third switch coupled between the operational amplifier output and the ground reference potential;
   a comparator having a first input coupled to an output terminal at a first node between the second resistive element and the second switch element, a second input coupled to an output node between the second resistive element and the second switch element through a fourth switch having a control terminal coupled to a driving signal source;

an output coupled to a control terminal at each of the first and second switches; and a timer circuit having a first input coupled to the driving signal source, a second input coupled to a reference clock, a third input coupled to the output of the comparator, and an output coupled to a control terminal on the third switch.

12. The circuit of claim 11 wherein the first input of the comparator comprises a non-inverting input, and the second input comprises an inverting input.

13. The circuit of claim 11, further comprising a capacitive element having a first terminal coupled to the inverting input of the comparator and a second terminal coupled to the ground reference potential.

14. The circuit of claim 13, further comprising an offset voltage circuit coupled in series between the output terminal and the non-inverting input of the comparator, the offset voltage circuit configured to output the sum of an output voltage from the output node and a predetermined offset voltage.

15. The circuit of claim 11 wherein the timer circuit comprises:

a counter configured to receive the reference clock and a counter output, a NAND operation circuit having a first input coupled with the counter output, a second input coupled with the comparator output, and an output; and an AND operation circuit with a first input coupled to the output of the NAND operation circuit, a second input coupled to the driving signal source, and an output that provides a switch control signal for the third switch.

16. The circuit of claim 15 wherein:

the counter provides a time lapse signal at its counter output when it has reached a predetermined count;

the fourth switch is configured to be driven by the driving signal source; and the timer circuit is configured to render the third switch conductive when a detection signal at the comparator output is not yet present at the end of the predetermined length of time from edge onset of the output voltage.

17. A method for controlling slew rate and detecting a short circuit, comprising:

controlling the slew rate of a pulsed output voltage from a control circuit in a first state as a function of a voltage curve across a first element in the control circuit;

generating a detection signal in a detection circuit when the pulsed output voltage differs by at least a predetermined value from the pulsed output voltage level before edge onset of the pulsed output voltage;

switching the control circuit to a second state when the detection signal is generated to initiate feedback-control of the pulsed output voltage slew rate as a function of the output voltage curve; and generating a timing signal in a timing circuit to switch the control circuit to the second state a predetermined length of time after edge onset of the pulsed output voltage when the detection signal is present at this time, and to switch the control circuit to a third state in which the control circuit is in a substantially dead state when the detection signal is not present at this time.

18. The method of claim 17 wherein generating a detection signal comprises generating a sum voltage signal from the sum of the pulsed output voltage and an offset voltage;

sampling and storing the pulsed output voltage before edge onset of the pulsed output voltage; and generating the detection signal when the sum voltage differs by a predetermined value from the stored pulsed output voltage.

19. The method of claim 17 wherein generating a timing signal comprises providing a time lapse signal at a counter output when the counter has reached a predetermined count and transmitting the time lapse signal to the control circuit to cause the control circuit to switch to the second state.

20. The method of claim 19 wherein generating a timing signal further comprises determining when the detection signal is not yet present when the time lapse signal is generated and transmitting a signal to the control circuit to cause the control circuit to switch to the third state.

* * * * *